(12) United States Patent
Harii et al.

(10) Patent No.: US 9,466,861 B2
(45) Date of Patent: Oct. 11, 2016

(54) BATTERY INSPECTION APPARATUS

(71) Applicant: Sumitomo Heavy Industries, Ltd., Tokyo (JP)

(72) Inventors: Tetsuo Harii, Kanagawa (JP); Sadanori Ishihara, Kanagawa (JP); Tsutomu Kawano, Tokyo (JP); Shinya Saitoh, Tokyo (JP)

(73) Assignee: SUMITOMO HEAVY INDUSTRIES, LTD., Shinagawa-Ku, Tokyo (JP)

( * ) Notice: Subject to any disclaimer, the term of this patent is extended or adjusted under 35 U.S.C. 154(b) by 760 days.

(21) Appl. No.: 13/774,109

(22) Filed: Feb. 22, 2013

(65) Prior Publication Data

US 2013/0164579 A1    Jun. 27, 2013

Related U.S. Application Data

(63) Continuation of application No. PCT/JP2011/004656, filed on Aug. 22, 2011.

(30) Foreign Application Priority Data

Aug. 23, 2010  (JP) .................................. 2010-186393

(51) Int. Cl.
*H01M 10/42*    (2006.01)
*H01M 2/20*    (2006.01)
*H01M 10/48*    (2006.01)
*H01M 10/6563*    (2014.01)
*H01M 10/6557*    (2014.01)
*H01M 10/617*    (2014.01)
*H01M 10/613*    (2014.01)
*G01R 31/36*    (2006.01)

(52) U.S. Cl.
CPC ........... *H01M 10/4207* (2013.01); *H01M 2/20* (2013.01); *H01M 10/4285* (2013.01); *H01M 10/482* (2013.01); *H01M 10/613* (2015.04); *H01M 10/617* (2015.04); *H01M 10/6557* (2015.04); *H01M 10/6563* (2015.04); *G01R 31/3627* (2013.01); *H01M 10/486* (2013.01)

(58) Field of Classification Search
None
See application file for complete search history.

(56) References Cited

FOREIGN PATENT DOCUMENTS

| JP | 10308242 A | 11/1998 |
|----|------------|---------|
| JP | 2001291531 A | 10/2001 |
| JP | 2004047363 A | 2/2004 |
| JP | 2004-319334 A | 11/2004 |

OTHER PUBLICATIONS

English translation of JP 2004-319334 obtained Sep. 24, 2015.*

(Continued)

*Primary Examiner* — Sarah A Slifka
(74) *Attorney, Agent, or Firm* — Buchanan Ingersoll & Rooney PC

(57) ABSTRACT

A battery inspection apparatus includes a temperature control system configured to provide a temperature control of the batteries by supplying a temperature control fluid through a battery supporting portion to flow, between adjacent batteries, the fluid along the side surfaces thereof and by discharging the fluid through a contactor supporting portion. The contactor supporting portion is provided to face the battery supporting portion and supports a plurality of contactors. The temperature control system may include at least one cross-flow fan that is arranged along an array direction of the batteries, a vent of the fan directed to the plurality of batteries, in order to supply an air flow toward the plurality of batteries.

7 Claims, 11 Drawing Sheets

(56) References Cited

OTHER PUBLICATIONS

English translation of JP 2004-047363 obtained Sep. 24, 2015.*
Patent Abstract for Japanese Publication No. 2004-319334 published Nov. 11, 2004 (1 page).
International Search Report for International Application No. PCT/JP2011/004656 dated Nov. 29, 2011, with English translation thereof (4 pages).
Written Opinion for International Application No. PCT/JP2011/004656 dated Nov. 29, 2011, with English translation thereof (6 pages).
Patent Abstract for Japanese Publication No. 2004-047363 published Feb. 12, 2004 (1 page).
Patent Abstract for Japanese Publication No. 10-308242 published Nov. 17, 1998 (1 page).
Patent Abstract for Japanese Publication No. 2001-291531 published Oct. 19, 2001 (1 page).

* cited by examiner

BATTERY INSPECTION APPARATUS

CROSS-REFERENCE TO RELATED APPLICATIONS

This application is a continuation of and claims priority to PCT/JP 2011/004656 filed on Aug. 22, 2011, which claims the benefit of and priority from Japanese Patent Application No. 2010-186393 filed on Aug. 23, 2010, the entire contents of these applications are incorporated herein by reference.

BACKGROUND OF THE INVENTION

1. Field of the Invention

The present invention relates to a battery inspection apparatus for inspecting a rechargeable battery.

2. Description of the Related Art

In Japanese Unexamined Patent Publication No. 2004-319334, a charge/discharge and inspection system of flat batteries are described. In this system, charge/discharge of a large number of second batteries and inspection for the batteries are collectively performed by arraying the batteries side by side in a battery housing container to connect electrodes to each of the batteries. In this charge/discharge and inspection system, four fans are provided on the ceiling board attached to the upper portion of pillars in order to cool lithium polymer batteries.

SUMMARY OF THE INVENTION

An embodiment of the present invention is a battery inspection apparatus for inspecting a plurality of rechargeable batteries. The apparatus includes: a battery supporting portion for the plurality of batteries arrayed in at least one line, each battery comprising a first end surface with an electrode thereon, a second end surface opposite to the first end surface, and a side surface connecting the first end surface and the second end surface, wherein side surfaces of adjacent batteries in the plurality of batteries spaced apart each other; a plurality of contactors, each configured to apply a voltage to one of the batteries by contacting the electrode thereof, the contactors arrayed in a manner corresponding to an array of the plurality of batteries; a contactor supporting portion provided to face the battery supporting portion and configured to support the plurality of contactors; and a temperature control system configured to provide a temperature control of the batteries by supplying a temperature control fluid through the battery supporting portion to flow the fluid along the side surfaces of the adjacent batteries and by discharging the fluid through the contactor supporting portion.

Another embodiment of the present invention is a battery inspection apparatus for inspecting a plurality of rechargeable batteries arrayed in at least one line. The apparatus includes at least one cross-flow fan configured to supply an air flow toward an array of the plurality of batteries, the cross-flow fan arranged along a direction of the array of the plurality of batteries, a vent of the fan directed to the plurality of batteries. The plurality of batteries are arrayed at a space to provide a channel for flowing the air flow between adjacent batteries such that the air flow is delivered from the vent of the cross-flow fan through the channel along a linear route.

BRIEF DESCRIPTION OF THE DRAWINGS

Embodiments will now be described, by way of example only, with reference to the accompanying drawings, which are meant to be exemplary, not limiting, and wherein like elements are is numbered alike in several figures, in which.

DETAILED DESCRIPTION OF THE INVENTION

The invention will now be described by reference to the preferred embodiments. This does not intend to limit the scope of the present invention, but to exemplify the invention.

In a battery inspection apparatus, it is required to maintain each of batteries at a temperature as uniform as possible during inspection. If a variation in the temperatures of the batteries is large during inspection, it becomes difficult to precisely distinguish between an increase in the temperature of a battery, occurring when the heat radiation of the battery is simply insufficient despite the normal condition of the battery, and heat generation of the battery, occurring due to abnormality of the battery.

Accordingly, a purpose of the present invention is to provide a battery inspection apparatus in which, when a plurality of rechargeable batteries are collectively inspected, the uniformity of the temperatures of each of the batteries can be enhanced.

According to an embodiment, a temperature control fluid can be linearly flowed from a battery supporting portion to a contactor supporting portion along the side surface of a battery. It becomes easy to increase the uniformity of a flow velocity distribution, and hence the uniformity of a temperature distribution obtained as a result of the heat transfer between the battery and the flow can also be increased. Further, because the flow passes through a contact portion where an electrode contacts a contactor and is discharged directly through the contactor supporting portion, an influence by the heat generated by a contact resistance in the electrode can also be suppressed.

Figure 1:
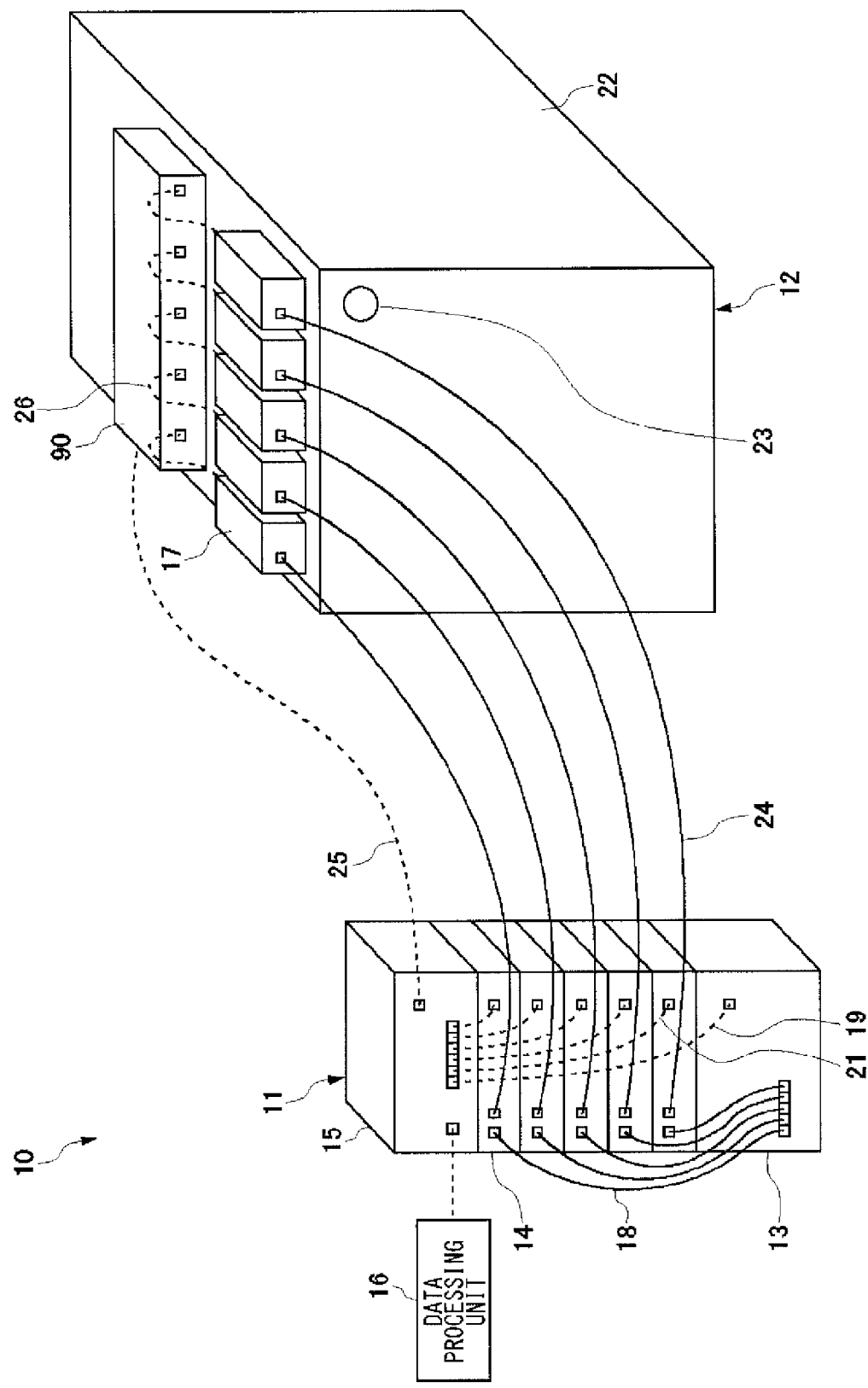
FIG. 1 is a view schematically illustrating the whole structure of a battery inspection apparatus according to an embodiment of the present invention.
Figure 2:
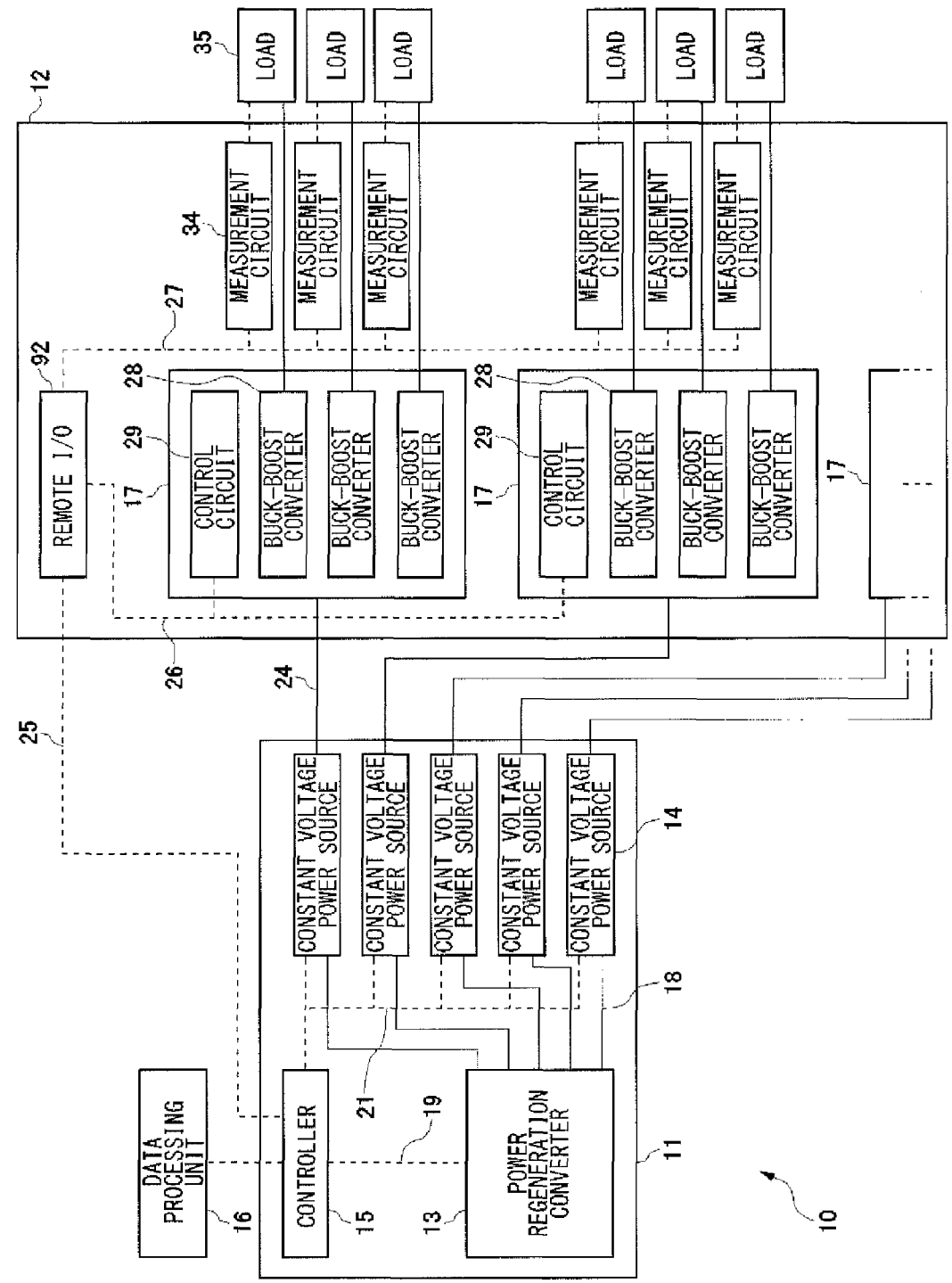
FIG. 2 is a block view schematically illustrating a power system and a communication control system in the battery inspection apparatus according to an embodiment of the invention.

FIG. 1 is a view schematically illustrating the whole structure of a battery inspection apparatus 10 according to an embodiment of the present invention. FIG. 2 is a block view for explaining a power system and a communication control system in the battery inspection apparatus 10 according to an embodiment of the invention. The battery inspection apparatus 10 is a charge-discharge test apparatus formed such that a large number of secondary batteries are charged and discharged to be collectively inspected. In FIGS. 1 and 2, the power system and communication control system in the battery inspection apparatus 10 are schematically illustrated. In the views, the solid lines each connecting respective elements represent power lines, and the dashed lines represent communication control lines.

The battery inspection apparatus 10 is formed to include an electric power device 11 and a battery inspection table 12. The electric power device 11 and the battery inspection table 12 are respectively formed as devices separate from each other, and connected to each other by a connection cable. The connection cable includes the power line and the control line. The electric power device 11 and the battery inspection table 12 may be installed, for example, adjacently or closely to each other. Alternatively, the electric power device 11 may be installed to be spaced apart from the battery inspection table 12. According to the present embodiment, the number of the connection wirings between the electric power device 11 and the battery inspection table 12 can be reduced, as described later, and hence it becomes easy to install the electric power device 11 and the battery inspection table 12 so as to be spaced apart from each other. Accordingly, flexibility of a layout for installing the battery inspection apparatus 10 is enhanced.

The electric power device 11 is formed to include a power regeneration converter 13, a constant voltage power source 14, and a controller 15. The power regeneration converter 13 relays an external power source (not illustrated) to the constant voltage power source 14. The external power source is, for example, a commercial power source, such as an alternating-current source to be used industrially. The power regeneration converter 13 functions as a power receiving circuit that receives power from the external power source, when batteries to be inspected in the inspection table 12 are charged; and functions so as to return power to the external power source, when the batteries are discharged. The power regeneration converter 13 is provided as a power regeneration converter common among a plurality of constant voltage power sources 14.

The constant voltage power source 14 adjusts the power supplied from the external power source via the power regeneration converter 13 to output it. For convenience, an output of the constant voltage power source 14 is hereinafter referred to as an intermediate output. The constant voltage power source 14 is formed such that a plurality of intermediate outputs can be generated. That is, the constant voltage power source 14 has a plurality of channels (e.g., several or more channels). Each of buck-boost converters 28 in a buck-boost unit 17 is connected to each of the channels (see FIG. 2). The intermediate output is supplied to the buck-boost unit 17 mounted in the inspection table 12. The intermediate output has a voltage and a current higher than the voltage and the current that are matched to an inspection specification of a battery. The constant voltage power source 14 is, for example, a DC-DC converter, and is preferably an isolated bidirectional DC-DC converter.

A plurality of the constant voltage power sources 14 are provided, each of which is connected to the power regeneration converter 13 by a DC link line 18. The DC link lines 18 whose number corresponds to that of the constant voltage power sources 14 are provided. In the illustrated example, five constant voltage power sources 14 are provided, and hence five DC link lines 18 are provided, the numbers of the constant voltage power sources 14 and the DC link lines 18 being equal to each other. Each of the constant voltage power sources 14 receives power from the power regeneration converter 13 through the DC link line 18, when a battery to be inspected is charged; and supplies power to the power regeneration converter 13 through the DC link line 18, when the battery is discharged.

The controller 15 is formed so as to control the battery inspection table 12, the power regeneration converter 13, and the constant voltage power source 14. The controller 15 and the power regeneration converter 13 are connected together by a first communication control line 19, and the controller 15 and the constant voltage power source 14 are connected together by a second communication control line 21. The second communication control lines 21 whose number corresponds to the number of the constant voltage power sources 14 are provided. The first communication control lines 19 and the second communication control lines 21 are provided separately from the DC link lines 18.

The power regeneration converter 13, the constant voltage power source 14, and the controller 15 are housed in an electric power device enclosure (not illustrated). The electric power device enclosure has, for example, a rack or a frame structure, by which a rectangular parallelepiped-shaped internal space for housing the power regeneration converter 13, the constant voltage power source 14, and the controller 15 is defined.

The electric power device enclosure houses: the power regeneration converter 13 in the lower portion; the controller 15 in the upper portion; and a plurality of the constant voltage power sources 14 between the power regeneration converter 13 and the controller 15. The power regeneration converter 13, the constant voltage power source 14, and the controller 15 are housed by being arrayed in the vertical direction (i.e., in a direction perpendicular to the floor surface) in the electric power device enclosure. Accordingly, the occupied floor area (so-called footprint) of the electric power device 11 can be reduced. The footprint of the electric power device 11 can be reduced to a size almost equal to or smaller than that of the inspection table 12. Alternatively, the power regeneration converter 13, the constant voltage power source 14, and the controller 15 may be arrayed, in the electric power device enclosure, in an order different from the illustrated order.

A data processing unit 16 is connected to the controller 15. The data processing unit 16 collects, via the controller 15, measured data obtained in the inspection table 12, such as a voltage, current, and temperature in a battery, to store them. The data processing unit 16 processes the collected data to output them by using an attached output means, such as a display, printer, or the like. The data processing unit 16 is, for example, a publicly-known personal computer. The controller 15 and the data processing unit 16 are connected together by a publicly-known method, such as, for example, an LAN.

The inspection table 12 is formed to include: an inspection stage on which a large number of batteries to be inspected are arrayed in a matrix; and a probe mechanism having a contactor, for example, a probe, which is used for inspecting the batteries. The probe mechanism has a large number of the probes provided in an array corresponding to the matrix array of the inspection units. That is, the battery inspection table 12 includes: an inspection stage on which mounting portions are arrayed in a matrix in order to hold a larger number of batteries; and a contactor array in which the contactors are arrayed in an array corresponding to the matrix array of the mounting portions.

Mounting positions for batteries are defined as the mounting portions in the inspection units in the battery inspection table. Each of the inspection units includes: a probe for inspection to contact a battery to be inspected; and a measurement circuit 34 for generating an analog measured signal by measuring at least one of a current, voltage, and temperature, based on an input from the probe. In the battery inspection table 12, the communication unit (e.g., remote I/O 92) is installed at a position opposite to that of the inspection stage (e.g., the later-described battery supporting portion 42) so as to sandwich the contactor array. The communication unit and the contactor array are arranged on the same side, when viewed from the inspection stage. That is, the communication unit is arranged behind the probe mechanism, when viewed from the inspection stage. The measurement circuit 34 is arranged between the contactor array and the communication unit.

With such a structure, the devices in the battery inspection table 12 are arranged in the order of the contactor array, the measurement circuit 34, and the communication unit from the side of the inspection stage. Thus, the measurement circuit 34 can be arranged closely to the communication unit. In one example, a control board 90, on which the communication unit and the measurement circuit 34 are mounted and electrically connected together, may be provided in the battery inspection table 12. With such a structure, the length of the wiring between the measurement circuit 34 and the communication unit can be minimized.

The inspection table 12 may include a transfer mechanism by which the inspection stage and the probe mechanism are moved relatively to each other such that the probe contacts and leaves a battery. In the inspection stage, a large number of batteries (e.g., several tens or more batteries) are arrayed in a matrix along a plane perpendicular to the vertical direction (e.g., a plane parallel to the floor surface). In this case, the transfer mechanism provides a vertical relative movement between the inspection stage and the probe mechanism.

The inspection stage and the probe mechanism are housed in a case 22 of the inspection table 12. The case 22 is formed into a rectangular parallelepiped shape, and an emergency stop switch 23 is provided on the side surface thereof. When an operator operates the emergency stop switch 23 in case of emergency, the movement of the battery inspection apparatus 10 can be stopped. Alternatively, the emergency stop switch 23 may be provided in the electric power device 11 or provided in each of the electric power device 11 and the inspection table 12.

A plurality of the buck-boost units 17 (in the view, five buck-boost units) and the control board 90 are mounted in the inspection table 12. The buck-boost units 17 and the control board 90 may be installed on the upper surface of the case 22, or may be installed in the case 22. The remote I/O 92 (see FIG. 2) is housed in the control board 90. The remote I/O 92 is connected to the controller 15 by a communication cable 25. Because the remote I/O itself is a publicly-known device, the detailed description of the structure thereof will be omitted. The communication cable 25 is a digital communication line through which multi-channel synchronous communication can be achieved. Transmission and reception of control commands from the electric power device 11 to the inspection table 12 and transmission of measured data from the inspection table 12 to the electric power device 11 are performed through the communication cable 25.

Each of the buck-boost units 17 is connected directly to the constant voltage power source 14 by a power cable 24. The power cable 24 is, for example, a four-core cable including a ground wire. Each of the buck-boost units 17 is connected to the remote I/O 92 by a communication line 26. The number of the buck-boost units 17 is equal to that of the constant voltage power sources 14, and the power cables 24 whose number is also equal to that of the constant voltage power sources 14 are provided. The buck-boost units 17 may be housed in the control board 90. Alternatively, a control power module for operating the buck-boost units 17 (not illustrated) may be provided in the control board 90.

In one example, the buck-boost units 17 can be provided, in the case 22 of the inspection table 12, in a compartment different from an inspection stage compartment where the inspection stage is arranged. Because the buck-boost units 17 need relatively large power, they can be provided to be spaced apart from the inspection units in the inspection table 12. For example, the buck-boost units 17 can be provided at the end of the inspection table 12. The above arrangement will be effective as a measure, when it is assumed that an inflammable gas may possibly leak out of a defective battery, of the batteries to be inspected. In this case, the buck-boost units 17 can be provided at the upper end or the lower end of the inspection table 12 in order to maintain the footprint of the inspection table 12. Also, in one example, an exhaust device for discharging the inflammable gas outside, such as a fan, may be provided in the inspection stage compartment where the inspection stage is arranged.

In one example, the case 22 has a structure in which the internal space thereof is closed from the external space to to hold housed objects so as not to be seen from outside, as illustrated. The case 22 includes a wall portion and a door portion (not illustrated) for defining the internal space. Alternatively, the case 22 may have a structure in which housed objects are opened to outside to be able to be seen from outside. Alternatively, the case 22 may have, for example, a rack, a frame body, or a frame structure.

As illustrated in FIG. 2, each of the buck-boost units 17 mounted in the inspection table 12 includes the plurality of the buck-boost converters 28 and a control circuit 29 for controlling these buck-boost converters 28. The buck-boost unit 17 includes, for example, an electric substrate on which electronic circuits, equivalent to the plurality of the buck-boost converters 28 and the control circuit 29, are formed. The control circuit 29 is connected to the remote I/O 92 through the communication line 26. The buck-boost units 17 includes, at a maximum, the buck-boost converters 28 whose number is equal to that of the channels of the constant voltage power sources 14. The buck-boost unit 17 preferably includes the buck-boost converters 28 whose number is equal to that of the channels of the constant voltage power sources 14. The plurality of the buck-boost converters 28 included in the buck-boost unit 17 are connected to the corresponding constant voltage power source 14 by the common power cable 24.

The buck-boost converters 28, whose number is, in total, equal to the number of the inspection units on the inspection stage, are provided in the inspection table 12. That is, one buck-boost converter 28 is matched to every inspection unit, and hence the buck-boost converters 28 whose number is equal to that of the inspection units are provided. The buck-boost converter 28 adjusts an intermediate output, which is inputted from the constant voltage power source 14 through the power cable 24, to a voltage and current matched to an inspection specification. An output of the buck-boost converter 28 is provided to a load 35 through each of the probes in the probe mechanism and is used for inspection. The load 35 is, for example, a secondary battery 40 to be inspected (see FIG. 3).

The measurement circuit 34 is provided correspondingly to each inspection unit. The measurement circuit 34 is associated with the inspection unit and installed in or around it. The measurement circuit 34 measures a state of the load 35, based on an input from each of the probes. The measurement circuit 34 includes, for example, at least one of a temperature measurement circuit, a voltage measurement circuit, and a current measurement circuit to measure at least one of the temperature, voltage, and current in the load 35. The measurement circuit 34 is formed as an analog sensor for generating an analog measured signal indicating the state of the load 35.

The measurement circuit 34 and the remote I/O 92 are connected together by an analog communication line 27. The analog communication line 27 is provided correspondingly to each of the measurement circuits 34, and outputs of a plurality of the measurement circuits 34 are inputted to the remote I/O 92. As illustrated in FIG. 2, one remote I/O 92 may be provided in the inspection table 12 such that outputs of all of the measurement circuits 34 are inputted to the remote I/O 92. Alternatively, a plurality of the remote I/Os 92 may be provided such that outputs of a plurality of the measurement circuits 34, corresponding to each of the remote I/Os 92, are inputted thereto. The remote I/O 92 transmits the measured data to the controller 15 in the electric power device 11 through the communication cable 25. The measured data is relayed by the controller 15 to be further transmitted to the data processing unit 16.

Figure 3:
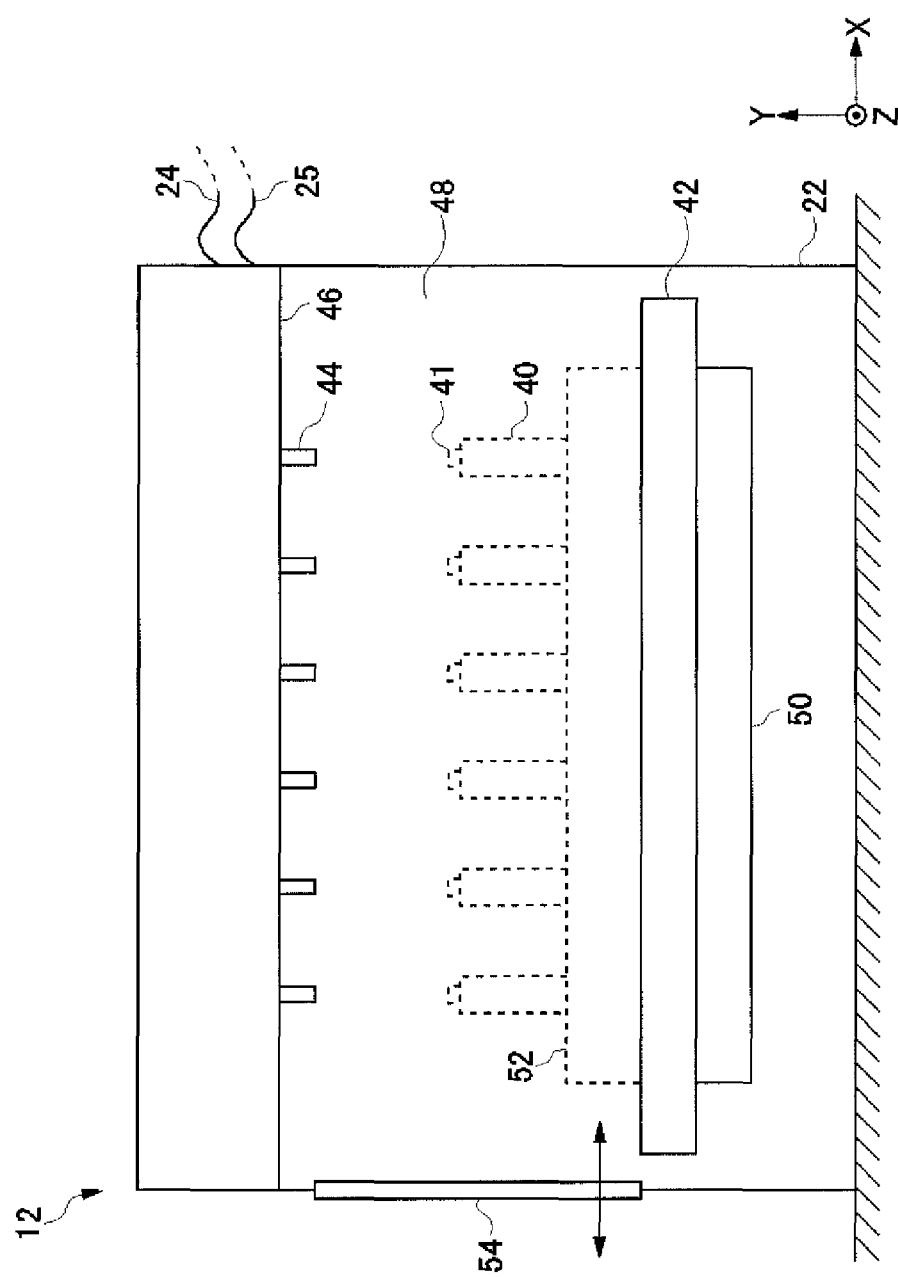
FIG. 3 is a view schematically illustrating a substantial portion of a battery inspection table according to an embodiment of the invention.
Figure 4:
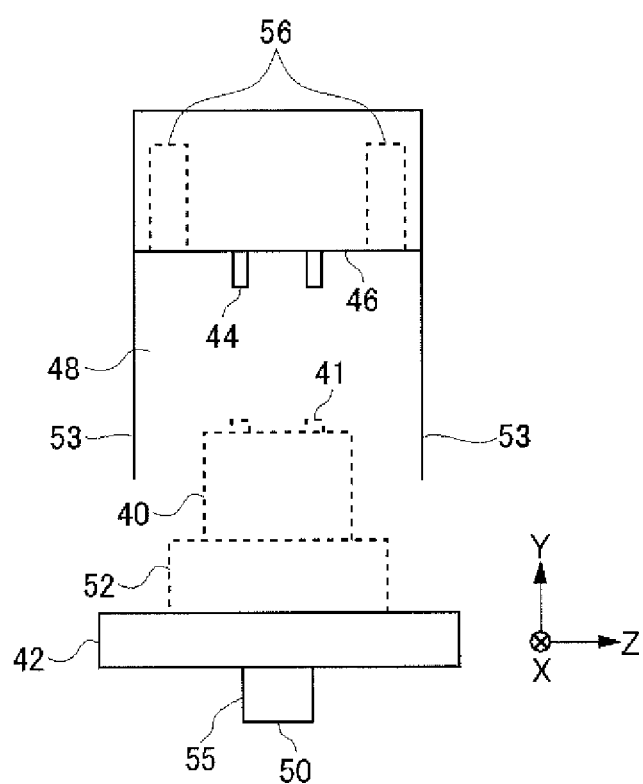
FIG. 4 is a view schematically illustrating a substantial portion of the battery inspection table according to an embodiment of the invention.
Figure 5:
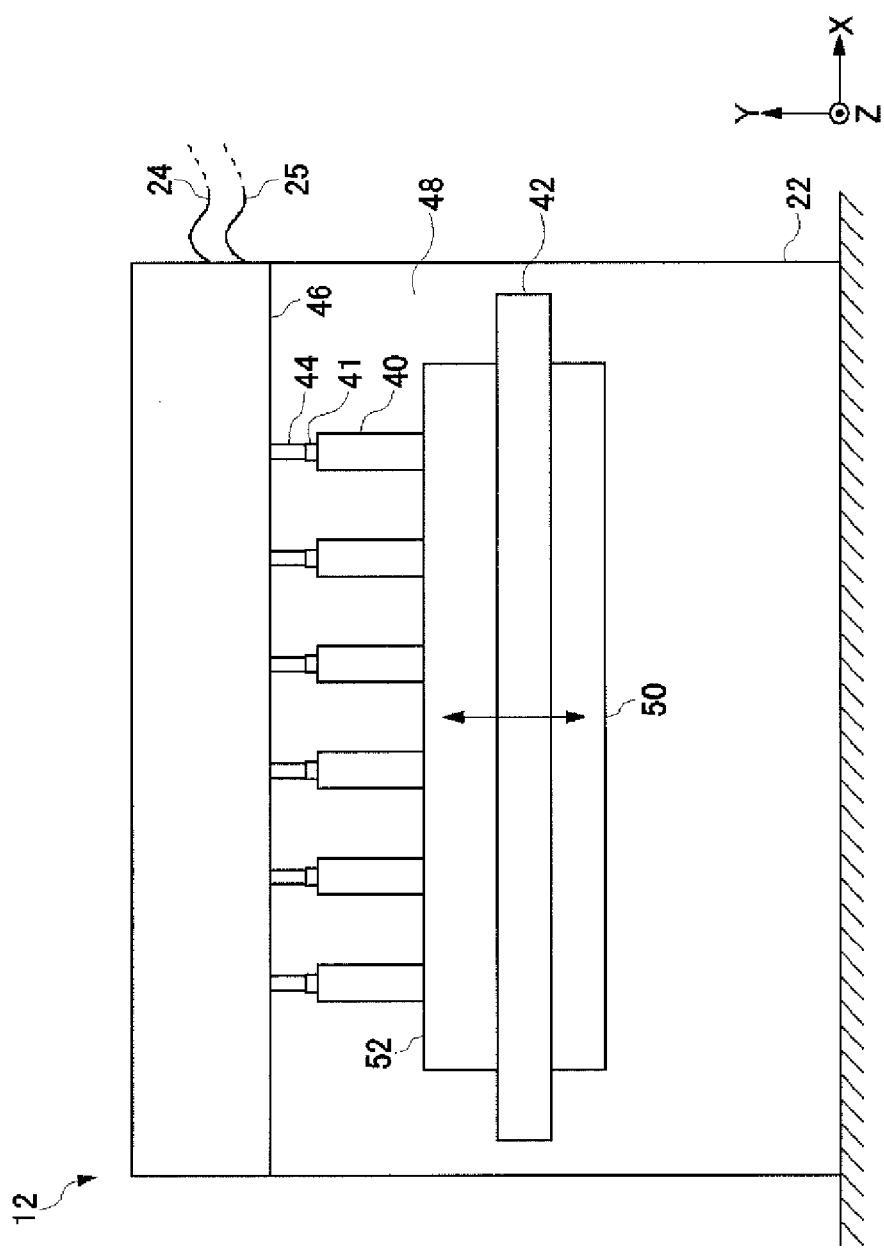
FIG. 5 is a view schematically illustrating a substantial portion of the battery inspection table according to an embodiment of the invention.
Figure 6:
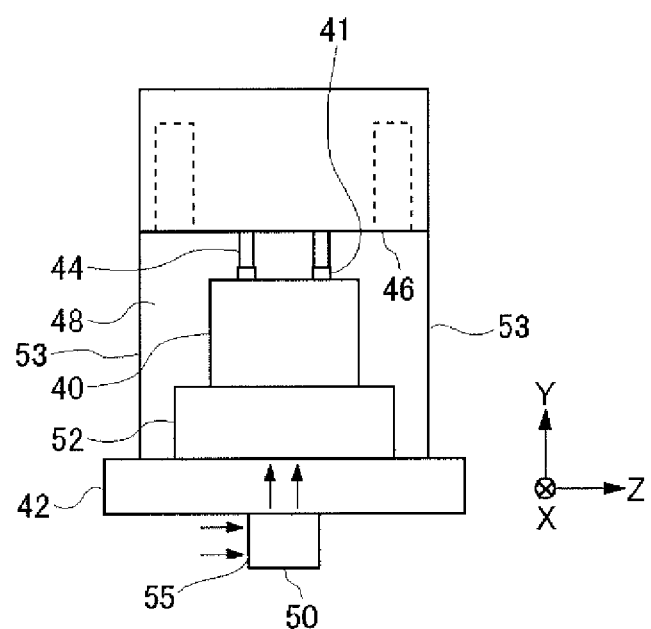
FIG. 6 is a view schematically illustrating a substantial portion of the battery inspection table according to an embodiment of the invention.

FIGS. 3 to 6 are views each illustrating a substantial portion of the battery inspection table 12 according to an embodiment of the present invention. FIGS. 3 and 4 are a front view and a side view, respectively, when the batteries 40 are conveyed into for inspection (or conveyed out after inspection). FIGS. 5 and 6 are respectively a front view and a side view each illustrating a state during inspection. FIGS. 4 and 6 are views, when the substantial portion illustrated in FIGS. 3 and 5 is viewed from the side, respectively. For convenience of description, an XYZ orthogonal coordinate system is defined as illustrated. That is, it is assumed that the array direction of the batteries 40 is X-direction, the vertical direction is Y-direction, and the direction perpendicular to both the directions is Z-direction.

As illustrated in FIGS. 3 to 6, the battery inspection table 12 is formed to include the battery supporting portion 42, the contactor 44, and the contactor supporting portion 46. They are housed in the case 22. In the illustrated example, the battery supporting portion 42 and the contactor supporting portion 46 face each other such that a battery array space 48 is formed between them. The battery supporting portion 42 is arranged downward in the vertical direction of the contactor supporting portion 46. A cross-flow fan 50 for adjusting the temperature of the battery 40 is attached below the battery supporting portion 42.

The battery 40 has: a first end surface having an electrode 41; a second end surface facing the first end surface; and a side surface connecting the first end surface and the second end surface. In the illustrated example, the battery 40 has a rectangular parallelepiped shape, and each of the batteries 40 is arrayed in the horizontal direction (X-direction), with the first end surface and the second end surface being located upward and downward, respectively, and with the side surfaces facing each other. The battery 40 is arrayed to be spaced apart from the adjacent battery 40. The side surface of the battery 40 is a surface parallel to the vertical direction (Y-direction). In the present example, the battery 40 is conveyed into the battery inspection table 12 for inspection and conveyed out, while being held on a pallet 52.

In FIG. 3, the arrow represents the direction in which the pallet 52 is conveyed into or out. The dashed lines represent positions where the pallet 52 and the batteries 40 mounted thereon are located when they are conveyed onto the battery supporting portion 42. The pallet 52 and the batteries 40 are conveyed into or out of the battery inspection table 12 by a non-illustrated pallet automatic conveyance device. Accordingly, part of the side wall of the battery inspection table 12 is formed as a door 54 that can be opened and closed. The door 54 is opened when the batteries 40 are conveyed into or out; while is closed when the batteries 40 are inspected. The battery array space 48 is partitioned from the external space during inspection by closing the door 54.

The battery supporting portion 42 is a supporting table on which a plurality of batteries to be inspected are mounted and supported. In the illustrated example, the battery supporting portion 42 supports the batteries 40 by supporting the pallet 52 on which the batteries 40 are mounted, instead of directly supporting the batteries 40. The battery supporting portion 42 is moved up and down by a vertically-moving mechanism (see FIG. 5). The batteries 40 are moved along with the pallet 52 by a movement of the battery supporting portion 42, thereby allowing the electrode 41 of the battery 40 to contact and leave the contactor 44.

As described later, a space is formed in the supporting table. This space may also be used as a baffle space for baffling an air flow that has been sent out of the cross-flow fan 50 and moves toward each of the batteries 40. In order to partition the space from outside, the supporting table may include: a battery supporting plate for supporting the batteries 40; an attaching plate for attaching the cross-flow fan 50; and a side surface plate for connecting the battery supporting plate and the attaching plate at the ends of both the plates.

The contactor 44 provides a voltage to each of the batteries 40 by contacting the electrode 41 of each of the batteries 40. Also, a contactor (not illustrated) for measuring the temperature, voltage, current, or the like, in the battery 40 is provided, as stated above. A plurality of contactors 44 are provided in an array corresponding to that of the plurality of batteries 40. In the illustrated example, six batteries are arrayed in a line such that the side surfaces thereof face each other, and correspondingly to that, six sets of the contactors 44 are similarly arrayed in a line. In one example, two electrodes 41 are provided in one battery 40, and two contactors 44 are provided correspondingly to that (see FIGS. 4 and 6).

Each of the contactors 44 is supported by the contactor supporting portion 46. The contactor supporting portion 46 is, for example, a supporting plate for supporting the contactors 44 and is provided so as to face the battery supporting portion 42. Each contactor 44 protrudes toward the battery supporting portion 42 from this supporting plate, and a space for housing various electric components 56, such as the aforementioned measurement circuit 34, buck-boost unit 17, and remote I/O 92, is secured on the side opposite to the battery supporting portion 42 (see FIG. 4). The power cable 24 and the communication cable 25, which connect the battery inspection table 12 to the electric power device 11, extend from the side opposite to the door 54 with respect to X-direction.

This electric component-housing space may also be partitioned from the battery array space 48 by the contactor supporting portion 46 in order to be used as an exhaust space for discharging an air flow that has been discharged from the battery array space 48, as described later. This exhaust space is also partitioned from the external space similarly to the aforementioned baffle space and the battery array space 48.

In the present example, the batteries 40 are arrayed in a line and six batteries 40 can be housed in the battery inspection table 12, as illustrated in FIGS. 4 and 6. The battery inspection table 12 can also be formed such that a further larger number of (or a smaller number of) batteries are housed. For example, the number of the batteries in the array direction (X-direction) may be made larger, or the number of lines in each of which the batteries 40 are arrayed may be made two or more. Further, several battery inspection units, each being formed to include the battery supporting portion 42, the contactors 44, and the contactor supporting portion 46, may be stacked each other in the vertical direction. Thus, the number of the batteries, which can be inspected collectively, can be made large.

The battery array space 48 is formed for every battery array line, and the cross-flow fan 50 is also attached for every battery array line. The cross-flow fan 50 is arranged along the array direction of the batteries 40. The cross-flow fan 50 is arranged in a state where the vent thereof faces the battery 40, so that air is sucked-in from the horizontal direction (Z-direction) and blown upward (Y-direction) toward the batteries 40, as illustrated in FIG. 6. As illustrated, the length in the array direction of the cross-flow fan 50 is made larger than or equal to that of the array of the batteries 40. Thus, the fan can be provided immediately below each of the batteries, and hence air flow velocity distributions around the respective batteries can be made equal to each other. A plurality of cross-flow fans 50 may be provided in the battery array direction for a single battery array line, or a plurality of the battery array lines may share a single cross-flow fan 50.

A temperature control fluid supply source according to an example of the present invention is not limited to a cross-flow fan. In stead of a cross-flow fan, a ventilator, such as, for example, a fan, circulator, blower, or the like, may be arranged along the array direction of the batteries 40. In this case, the ventilator can be provided with an elongated vent extending in the battery array direction and the vent can be arranged to face each of the batteries. Alternatively, the uniformity of the flows may be enhanced by using a baffle plate between the vent and the battery. Thus, a substantially uniform air flow velocity distribution can be provided to a channel between adjacent batteries. In still another example, a temperature control fluid supply source may be formed so as to flow a temperature control gas, other than ambient air, or a liquid along the surface of the battery.

Figure 7:
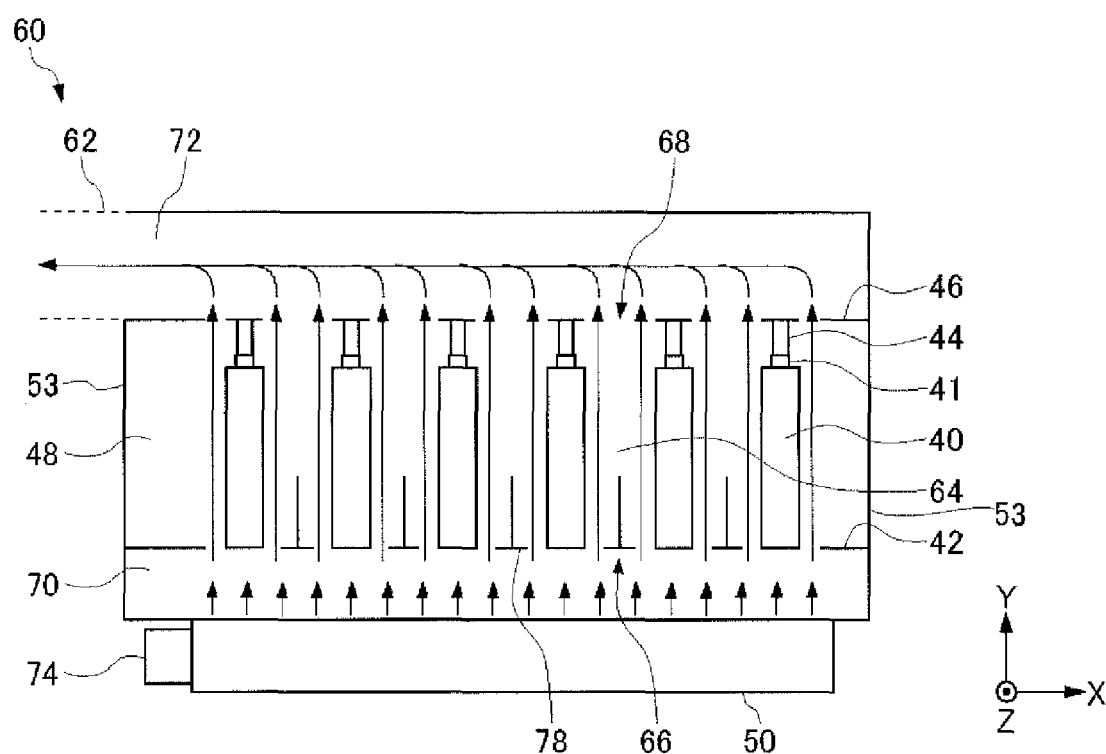
FIG. 7 is a view illustrating a temperature control system in the battery inspection table according to an embodiment of the invention.

FIG. 7 is a view illustrating a temperature control system 60 in the battery inspection table 12 according to an embodiment of the present invention. In order to perform temperature control by convection heat transfer between a temperature control fluid and the surface of the battery, the temperature control system 60 is formed so as to supply the temperature control fluid to the battery array space 48 in which a plurality of batteries 40 are arrayed and to discharge the fluid therefrom.

In one example, the temperature control fluid is the air blown from the cross-flow fan 50, and the temperature control system 60 finally discharges the air supplied from the cross-flow fan 50 to an exhaust duct 62. The temperature control system 60 supplies an air flow from the cross-flow fan 50 through the battery supporting portion 42, and discharges the air flow to the exhaust duct 62 through the contactor supporting portion 46. The temperature of each battery 40 is controlled with an air flow flowing, between adjacent batteries 40, along the side surfaces thereof. Although heat is usually generated by each battery 40 during inspection, each battery 40 is cooled to a desired temperature range by the air flow.

As illustrated in FIG. 7, an air flow flows from the cross-flow fan 50 into a baffle space 70, the battery array space 48, and an exhaust space 72, the latter three of which are adjacent to each other, and is finally discharged from the exhaust duct 62. For example, the baffle space 70 is the internal space in the battery supporting portion 42 and the exhaust space 72 is a space above the contactor supporting portion 46. The exhaust duct 62 is connected to the exhaust space 72. When the battery inspection table 12 is formed such that a plurality of battery array lines can be housed, the temperature control system 60 may be provided to be separated for every battery array line.

The battery 40 is arrayed so as to have a temperature control channel 64 for flowing a temperature control fluid along at least one surface of the battery 40, the surface facing another battery 40 adjacent in the battery array direction. That is, the temperature control channel 64 is defined by the side surfaces of adjacent two batteries 40, and the batteries 40 and the temperature control channels 64 are lined up alternately in the array direction.

A plurality of supply ports 66 for flowing a temperature control fluid into the temperature control channels 64 are formed in the battery supporting portion 42 and in an array corresponding to the channel arrangement, and a plurality of exhaust ports 68 for discharging a temperature control fluid are formed in the contactor supporting portion 46 and in a similar array. That is, each of the supply ports 66 is formed between the positions at which adjacent batteries 40 are supported, and each of the exhaust ports 68 is formed between adjacent contactors 44. Thus, the temperature control channel 64 between adjacent batteries 40, each of the supply ports 66, and each of the exhaust ports 68 are linearly aligned. Further, the vent of the cross-flow fan 50 is provided to face each of the supply ports 66. Thus, the temperature control system 60 is formed such that an air flow, which is sent out of the vent of the cross-flow fan 50 and passes through each of the channels 64, flows along a linear route.

The supply port 66 communicates the baffle space 70 and the battery array space 48. The baffle space 70 is provided as an area where an air flow sent out of the cross-flow fan 50 is spread in the direction in which the cross-flow fan 50 is arranged (i.e., battery array direction) and in the direction perpendicular to the air flow direction (Z-direction in FIG. 7). By spreading an air flow with the baffle space 70, a velocity distribution in the width direction of the battery 40 can be made as uniform as possible. When this uniformity is considered to be important, the height in Y-direction of the baffle space 70 may be made large, or a plurality of the cross-flow fans 50 may be arranged in the width direction for a single battery array line. On the other hand, it may be considered to be important to make the height of the battery inspection table 12 to be small by making the height in Y-direction of the baffle space 70 to be small.

A partition plate 78 for baffling may be provided in the supply port 66. The partition plate 78 is formed, for example, in the pallet 52. Although the partition plate 78 extends from the supply port 66 near to the middle of the battery array space 48 in the illustrated example, the partition plate 78 may be longer or shorter than that. For example, the partition plate 78 may extend from the supply port 66 to the exhaust port 68. The partition plate 78 may be provided in order to prevent radiation heat occurring between adjacent batteries 40. With such a structure, it can be suppressed that a battery abnormally generating heat may heat the surrounding batteries.

The exhaust port 68 communicates the battery array space 48 and the exhaust space 72. The exhaust space 72 is provided as an area where the air that has flowed through the battery array space 48 is guided to the exhaust duct 62. As illustrated in FIG. 4, the electric components 56 may be housed in the exhaust space 72. Thereby, the air flow can also be used for cooling the electric components 56. In this case, the electronic components 56 can be installed in such a way that the central portion of the exhaust space 72 is not occupied, in order not to hamper the flow moving toward the exhaust duct 62. The electric components 56 can be installed, for example, along the wall portion by which the exhaust space 72 is partitioned from the external space.

In the present example, the cross-flow fan 50, as a temperature control fluid supply source, is provided in the vertically lowest portion of the temperature control system 60, and toward the upper side in the vertical direction, the baffle space 70, the battery array space 48, and the exhaust space 72 are formed. Therefore, the air flow sent out of the cross-flow fan 50 flows linearly from the lower side to the upper side in the vertical direction. The natural convection by the heat generated by the battery 40 also flows from the lower side to the upper side in the vertical direction. Accordingly, in the present example, the temperature control fluid can be discharged from the battery array space 48 by a combination of the forced convection by the cross-flow fan 50 and the natural convection. Thereby, an adverse effect on the temperature uniformity by stagnation of air and the reheating of a battery, both occurring due to the natural convection by the heat generated by the battery 40, can be suppressed. Further, because a flow, which has passed through a contact portion where the electrode 41 contacts the contactor 44, is discharged directly to the exhaust port 68, an influence by the heat generated by a contact resistance can also be suppressed.

The flow direction of an air flow is not limited to one from the lower side to the upper side in the vertical direction. When an influence by the natural convection or the contact resistance is not considered to be too large, an air flow may be made to flow, for example, from the upper side to the lower side in the vertical direction. In this case, the cross-flow fan 50 is attached, for example, to the ceiling plate in the battery inspection table 12. Alternatively, an air flow may be made to flow in the horizontal direction.

Figure 8:
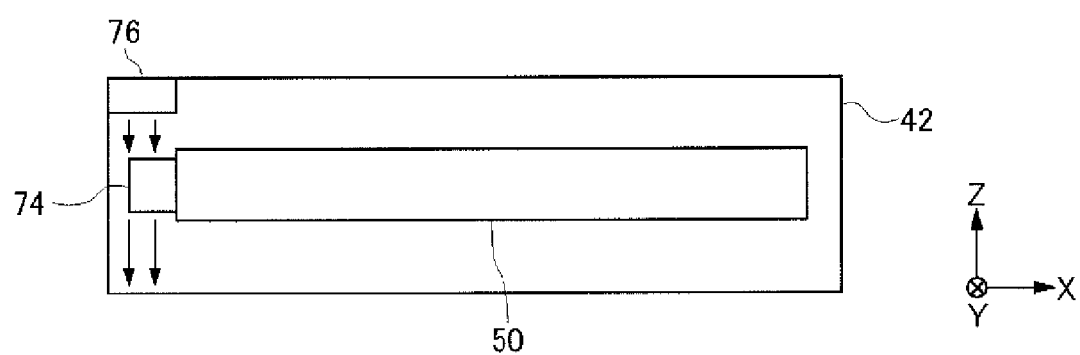
FIG. 8 is a view illustrating a cooling device of a cross-flow fan according to an embodiment of the invention.

FIG. 8 is a view illustrating a cooling device of the cross-flow fan 50 according to an embodiment of the present invention. As illustrated in FIGS. 7 and 8, the cross-flow fan 50 is driven by a motor 74 attached to the end in the longitudinal direction of the fan. The motor 74 is arranged further outside the battery 40 located in the outermost area in the array direction (X-direction) of the batteries 40. That is, the motor 74 is attached at a position where, when viewed from the flow direction of an air flow, the motor 74 is not overlapped on the array line of the batteries 40. With such a structure, an influence on the battery 40 by the heat generated by the motor 74 can be suppressed. On the other hand, in the case of a typical axial fan, a motor is located at the center thereof, and hence the heat generated by the motor is sent forward by an air current of the fan. Accordingly, when air is blown to the battery 40 by an axial fan, the heat generated by the motor is carried by the air current towards the battery 40.

As illustrated in FIG. 8, a ventilator 76 for cooling the motor 74 is further provided. The motor 74 is cooled by the ventilator 76, and hence an influence by the heat generated by the motor 74 can be further suppressed. The ventilator 76 is installed, for example, so as to send an air flow, flowing in the direction intersecting with (e.g., the direction perpendicular to) the flow direction of the air flow sent out by the cross-flow fan 50, to the motor 74. The ventilator 76 is attached to the lower surface of the battery supporting portion 42, similarly to the cross-flow fan 50.

The battery inspection table 12 may include a cover 53 surrounding the circumference of an array of a plurality of batteries 40 (see FIGS. 4, 6, and 7). The cover 53 is provided so as to isolate the battery array space 48, through which the temperature control fluid flows during the inspection of the battery 40, from the intake vent 55 of the cross-flow fan 50. Accordingly, the cover 53 includes four flat plates each extending, at each of the four sides of the array of the batteries 40, downward from the contactor supporting portion 46. The end of the cover 53 is formed so as to contact the battery supporting portion 42 when the battery 40 is connected to the contactor 44 by the up-down movement of the battery supporting portion 42. In such a way, the space surrounding the array of the batteries 40 is partitioned. An outflow or leak of the temperature control fluid, which is to be discharged through the contactor supporting portion 46, is suppressed by the cover 53. It can be prevented that the temperature control fluid, which has been heated by cooling the battery 40, may again flow into the intake vent 55 of the cross-flow fan 50.

Alternatively, the cover 53 may be provided in the battery supporting portion 42. The cover 53 may be formed, for example, to extend upward from the battery supporting portion 42, instead of the aforementioned cover 53 extending downward from the contactor supporting portion 46.

Figure 9:
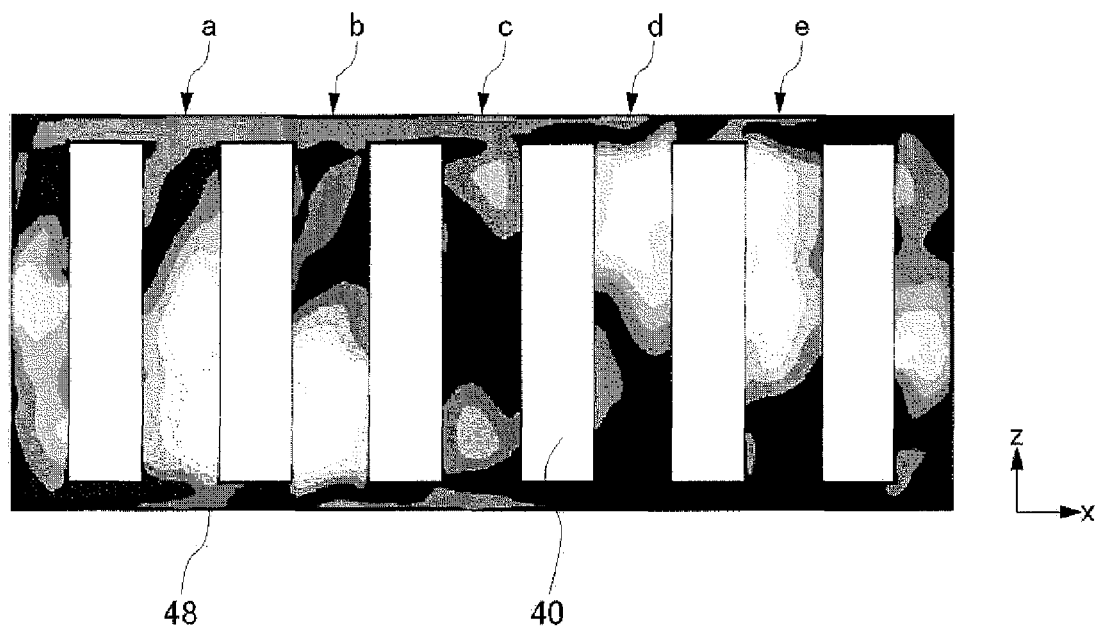
FIG. 9 is a view illustrating an air flow velocity distribution in a comparative example.

FIG. 9 is a view illustrating, as a comparative example, a simulation result of an air flow velocity distribution occurring when an axial fan is used. An air flow velocity distribution around the battery 40 in the battery array space 48 is illustrated by the gray scale. It is represented that, as the color is whiter, the velocity is higher, and as the color is blacker, the velocity is lower. The simulation result illustrated in FIG. 9 represents an air flow velocity distribution occurring when an axial fan is attached to the central portion on the lower side of the battery supporting portion 42, instead of the cross-flow fan 50.

As understood at first glance, the velocity distributions in channels a to e between the adjacent batteries 40 are non-uniform. This is because the flow sent out from an axial fan has a velocity component in the rotational direction (i.e., a velocity component in X-Z plane). When this rotational flow enters the battery array space 48, an air flow velocity distribution around a battery varies, depending on the array position of the battery. For example, the velocity in the channel a is generally higher than that in the channel c. Accordingly, the cooling of the batteries 40 facing channel c is more likely to be insufficient than the batteries 40 facing the channel a.

Figure 10:
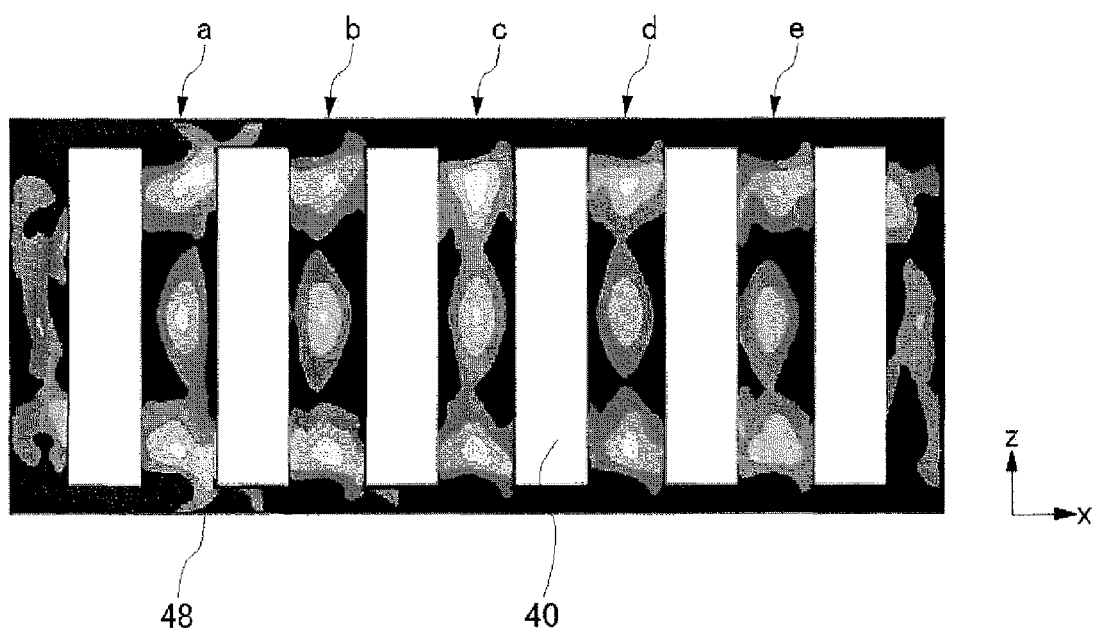
FIG. 10 is a view illustrating an air flow velocity distribution according to an embodiment of the invention.

FIG. 10 is a view illustrating a simulation result of an air flow velocity distribution according to an embodiment of the present invention. As described with reference to FIGS. 3 to 8, the simulation result illustrated in FIG. 10 is represents an air flow velocity distribution occurring when a cross-flow fan 50 is attached, along the battery array direction, to the lower portion of the battery supporting portion 42. A flow from the cross-flow fan 50 is linear and does not have a rotational component. As illustrated in FIG. 10, the velocity distributions in the channels a to e between the adjacent batteries 40 are almost the same as each other. That is, a substantially identical velocity distribution is formed in each of the channels a to e. Accordingly, it can be considered that each of the batteries is cooled uniformly.

As stated above, according to an embodiment of the present invention, a fan is provided immediately below each of the batteries to be inspected such that air is supplied, from the fan, so as to linearly flow around the battery. The air heated by the convection heat transfer with the surface of the battery under inspection is discharged from an exhaust port located on the upper side. With this structure, a substantially identical air flow velocity distribution is formed around a battery, independent of the position of the battery, and hence it becomes possible to uniformly control the temperature of each battery.

By adopting the cross-flow fan 50, it is easy to install the fan immediately below each of the batteries arrayed in one line. Further, it is not needed to consider an influence by a rotational component of a flow. Furthermore, because a motor for driving the fan can be arranged outside the battery array space, an influence by the heat generated by the motor can be suppressed. A fan for cooling the motor is also provided. With such a structure, a battery inspection apparatus can be achieved, in which: an air flow velocity distribution around a battery, and eventually a temperature distribution can be made uniform; and an influence on battery inspection by the heat generated by a motor for driving a fan can be substantially eliminated.

Figure 11:
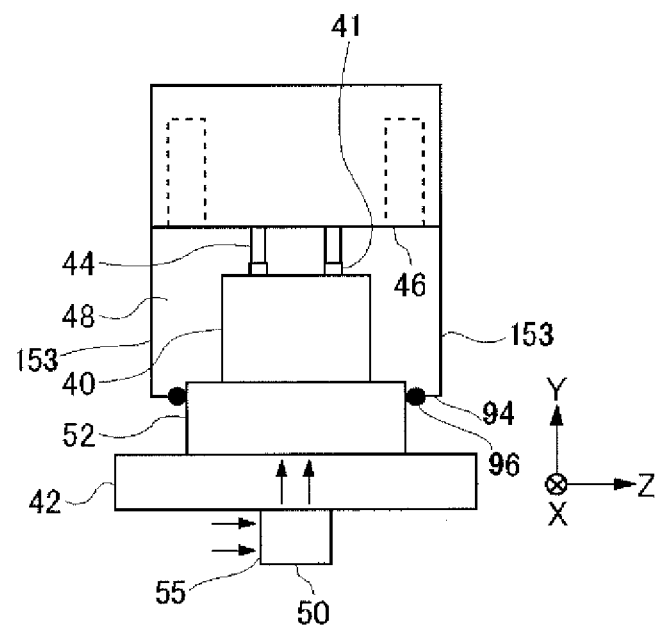
FIG. 11 is a sectional view schematically illustrating a battery inspection table according to one embodiment.

FIG. 11 is a sectional view schematically illustrating the battery inspection table 12 according to an embodiment. The example illustrated in FIG. 11 is the same as that described with reference to FIGS. 1 to 10, except that the structure of a cover 153 is different. In the following description, description of the similar parts will be appropriately omitted in order to avoid redundancy.

The cover 153 is provided so as to isolate the battery array space 48, through which the temperature control fluid flows during the inspection of the battery 40, from the intake vent 55 of the cross-flow fan 50. Accordingly, the cover 153 surrounds the whole circumference of an array of the batteries 40. The cover 153 extends, at the circumference of the array of the batteries 40, downward from the contactor supporting portion 46. At the end of the cover 153, a bent portion 94 extending toward the inside of the battery array space 48 is formed, unlike the cover 53 illustrated in FIGS. 4, 5, and 7 in which the end of the cover 53 extends straight. The cover 153 is formed, for example, of a metal thin plate.

The bent portion 94 is formed at the whole circumference of the cover 153. The tip of the bent portion 94 is formed so as to contact the pallet 52 when the battery 40 is connected to the contactor 44 by the up-down movement of the battery supporting portion 42. In the illustrated example, the battery inspection table 12 is formed such that the tip of the bent portion 94 contacts the side surface of the pallet 52; however, the battery inspection table 12 may be formed such that the tip of the bent portion 94 contacts the upper surface of the pallet 52.

Thus, the space surrounding an array of the batteries 40 is partitioned. Accordingly, the space surrounding an array of the batteries 40 is isolated from the intake vent 55 of the cross-flow fan 50 by the cover 153. The temperature control fluid moving from the battery 40 to the contactor supporting portion 46 is heated by cooling the battery 40. An outflow or leak of the temperature control fluid, which is to be discharged through the contactor supporting portion 46, is suppressed by the cover 153. Thus, it can be prevented that the temperature control fluid may again flow into the intake vent 55 of the cross-flow fan 50. When the temperature of the air around the cross-flow fan 50 is precisely controlled, the cover 153 can be provided in order to prevent a temperature variation created by the fluid heated by cooling the battery 40.

A seal 96 may be attached to the tip of the bent portion 94. The seal 96 may be formed at the whole circumference of the cover 153. The seal 96 is formed, for example, of rubber. By making the cover 153 and the pallet 52 to contact each other via the seal 96, leak of the temperature control fluid can be better prevented.

The position of the end of the cover 153 (position of the bent portion 94) in the direction in which the battery supporting portion 42 moves (i.e., Y-direction) is designed such that, when the pallet 52 on which the battery 40 is mounted is conveyed, the cover 153 and the battery 40 (or the pallet 52) do not interfere with each other. That is, it is designed such that, when the battery supporting portion 42 is present at the position at which the pallet 52 is to be conveyed, the position of the end of the cover 153 is at a position higher than that of the upper end of the battery 40 (or pallet 52). When compared with the cover 53 illustrated in FIG. 6, the end of the cover 153 (bent portion 94) illustrated in FIG. 11 is present at a higher position (upper side in Y-direction). By making the length of the cover 153 to be small in such a way, the position of the battery supporting portion 42 can also be made high, when the pallet 52 is conveyed to the battery supporting portion 12. As a result, the moving stroke of the battery supporting portion 42 becomes small, and hence the height of the battery inspection table 12 can be made small.

The present invention has been described above based on the embodiments. It should be appreciated by those skilled in the art that the invention is not limited to the above embodiments but various design modifications and variations can be made, and such variations are also encompassed by the present invention.

Although the battery 40 is placed on the pallet 52 with the electrode 41 being oriented upward (so to speak, vertically) in the aforementioned examples, the way in which the battery 40 is placed is not limited thereto. For example, the battery 40 may be placed on the pallet 52 with the electrode 41 being oriented horizontally.

Although the cover 153 is formed to extend downward from the contactor supporting portion 46 in the aforementioned examples, the structure of the cover 153 is not limited thereto. For example, the cover 153 may be provided in the battery supporting portion 42. Alternatively, the cover 153 may be formed to extend upward from the battery supporting portion 42.

In addition, although the cover 153 is formed by a plate-shaped member in the aforementioned examples, the structure of the cover 153 is not limited thereto. For example, the cover 153 may be a film-shaped member. In this case, the cover 153 may be, for example, a curtain hung so as to surround the circumference of the array of the batteries 40.

It should be understood that the invention is not limited to the above-described embodiment, but-may be modified into various forms on the various forms on the basis of the spirit of the invention. Additionally, the modifications are included in the scope of the invention.

What is claimed is:

1. A battery inspection apparatus for inspecting a plurality of rechargeable batteries, the apparatus comprising:

a battery supporting portion comprising a battery supporting plate capable of supporting a battery holding pallet holding the plurality of batteries such that the batteries are horizontally arrayed in at least one line, each battery comprising a first end surface with an electrode thereon, a second end surface opposite to the first end surface, and a side surface connecting the first end surface and the second end surface in a battery height direction, wherein side surfaces of adjacent batteries in the plurality of batteries spaced are apart each from other to form vertical airflow channels therebetween and extending along the battery height direction, the battery supporting plate having airflow supply ports formed between positions at which the adjacent batteries are supported;

a plurality of contactors, each configured to apply a voltage to one of the batteries by contacting the electrode thereof, the contactors horizontally arrayed in a manner corresponding to an array of the plurality of batteries;

a contactor supporting portion provided to face the battery supporting portion and configured to support the plurality of contactors, the contactor supporting portion comprising airflow exhaust ports formed corresponding to the airflow supply ports such that the airflow supply ports, the vertical airflow channels and the airflow exhaust ports are linearly aligned, respectively;

a vertical upward airflow source fluidly coupled to the vertical airflow channels to generate a vertical upward airflow flowing from the airflow supply ports through the vertical airflow channels to the airflow exhaust ports in order to provide a temperature control of the batteries; and a cover wall extending along the battery height direction and surrounding the batteries and at least part of the battery holding pallet, wherein the battery supporting portion comprises a source attachment plate to which the vertical upward airflow source is attached and a side surface plate connecting the source attachment plate to the battery supporting plate, wherein the side surface plate, the source attachment plate and the battery supporting plate in combination defines an airflow supplying compartment such that the vertical upward airflow is received from the vertical upward airflow source and supplied to the vertical airflow channels through the airflow supply ports, and the vertical upward airflow source comprises at least one cross-flow fan arranged along an array direction of the plurality of batteries to blow ambient air to the batteries.

2. The battery inspection apparatus according to claim 1, wherein the vertical upward airflow source is located vertically below the battery supporting portion, wherein, during an inspection of the batteries, the battery holding pallet is loaded onto the battery supporting plate and vertically between the battery supporting portion and the contactors, and wherein the contactor supporting portion is located vertically above the contactors.

3. The battery inspection apparatus according to claim 1, wherein a length of the cross-flow fan in the array direction is larger than a length of the array of the plurality of batteries, and a substantially identical air flow velocity distribution is formed around each of the batteries.

4. The battery inspection apparatus according to claim 1, wherein a motor for driving the cross-flow fan is located, in the array direction, outside the array of the plurality of batteries.

5. The battery inspection apparatus according to claim 4, wherein a ventilator for cooling the motor is provided.

6. The battery inspection apparatus according to claim 1, wherein the battery supporting portion is arranged linearly movable in the battery height direction relative to the contactor supporting portion and, during an inspection of the batteries, the cover wall in combination with the battery supporting portion and the contactor supporting portion forms an enclosed battery inspection chamber by a movement of the battery supporting portion relative to the contactor supporting portion.

7. The battery inspection apparatus according to claim 1, further comprising an exhaust duct discharging the airflow out of the battery inspection apparatus, wherein the contactor supporting portion partly defines an enclosed exhaust compartment for guiding the airflow from the exhaust ports to the exhaust duct.

* * * * *